(12) United States Patent
Doogue et al.

(10) Patent No.: US 7,816,905 B2
(45) Date of Patent: Oct. 19, 2010

(54) ARRANGEMENTS FOR A CURRENT SENSING CIRCUIT AND INTEGRATED CURRENT SENSOR

(75) Inventors: Michael C. Doogue, Manchester, NH (US); Richard Dickinson, South Boston, MA (US); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 153 days.

(21) Appl. No.: 12/131,339

(22) Filed: Jun. 2, 2008

(65) Prior Publication Data

US 2009/0295368 A1 Dec. 3, 2009

(51) Int. Cl.
*G01R 15/20* (2006.01)
(52) U.S. Cl. .................................. 324/117 H
(58) Field of Classification Search ........................ None
See application file for complete search history.

(56) References Cited

U.S. PATENT DOCUMENTS

| | | |
|---|---|---|
| 4,283,643 A | 8/1981 | Levin |
| 4,343,026 A | 8/1982 | Griffith et al. |
| 4,385,273 A | 5/1983 | Lienhard et al. |
| 4,525,668 A | 6/1985 | Lienhard et al. |
| 4,596,950 A | 6/1986 | Lienhard et al. |
| 4,691,259 A | 9/1987 | Imakoshi et al. |
| 4,712,064 A | 12/1987 | Eckardt et al. |
| 4,772,929 A | 9/1988 | Manchester |
| 4,823,075 A | 4/1989 | Alley |
| 4,847,584 A | 7/1989 | Pant |
| 4,922,606 A | 5/1990 | Alexander et al. |
| 4,926,116 A | 5/1990 | Talisa |
| 4,937,521 A | 6/1990 | Yoshino et al. |
| 4,939,448 A | 7/1990 | Gudel |
| 4,939,449 A | 7/1990 | Cattaneo et al. |
| 4,939,459 A | 7/1990 | Akachi et al. |
| 5,041,780 A | 8/1991 | Rippel |
| 5,049,809 A | 9/1991 | Wakatsuki et al. |
| 5,218,279 A | 6/1993 | Takahashi et al. |
| 5,227,721 A | 7/1993 | Kataoka et al. |
| 5,247,202 A * | 9/1993 | Popovic et al. .............. 324/251 |
| 5,351,027 A | 9/1994 | Kawamata et al. |

(Continued)

FOREIGN PATENT DOCUMENTS

CH         683469 A5     3/1994

(Continued)

OTHER PUBLICATIONS

PCT Search Report and Written Opinion of the ISA for PCT/US2009/044614 dated May 20, 2009.

(Continued)

*Primary Examiner*—Jermele M Hollington
(74) *Attorney, Agent, or Firm*—Daly, Crowley, Mofford & Durkee, LLP

(57) ABSTRACT

An electronic circuit for sensing a current includes a circuit board having first and second major opposing surfaces and a current conductor for carrying the current. The current conductor includes a circuit trace disposed upon the circuit board. The electronic circuit also includes an integrated circuit disposed upon and electrically coupled to the circuit board at a position so as to straddle the current conductor.

18 Claims, 12 Drawing Sheets

U.S. PATENT DOCUMENTS

| | | | |
|---|---|---|---|
| 5,442,283 A | 8/1995 | Vig et al. | |
| 5,500,590 A | 3/1996 | Pant | |
| 5,561,366 A | 10/1996 | Takahashi et al. | |
| 5,561,368 A | 10/1996 | Dovek et al. | |
| 5,570,034 A | 10/1996 | Needham et al. | |
| 5,583,725 A | 12/1996 | Coffey et al. | |
| 5,621,377 A | 4/1997 | Dettmann et al. | |
| 5,686,838 A | 11/1997 | Van den Berg | |
| 5,686,879 A | 11/1997 | Schuhl et al. | |
| 5,719,494 A | 2/1998 | Dettmann et al. | |
| 5,831,426 A | 11/1998 | Black, Jr. et al. | |
| 5,877,705 A | 3/1999 | Sampey | |
| 5,883,567 A | 3/1999 | Mullins, Jr. | |
| 5,896,030 A | 4/1999 | Hasken | |
| 5,945,825 A | 8/1999 | Clemens | |
| 5,952,825 A | 9/1999 | Wan | |
| 6,002,553 A | 12/1999 | Stearns et al. | |
| 6,031,273 A | 2/2000 | Torok et al. | |
| 6,094,330 A | 7/2000 | Criniti et al. | |
| 6,100,686 A | 8/2000 | Van Delden et al. | |
| 6,175,296 B1 | 1/2001 | Tokunaga et al. | |
| 6,184,679 B1 | 2/2001 | Popovic et al. | |
| 6,300,617 B1 | 10/2001 | Daughton et al. | |
| 6,315,875 B1 | 11/2001 | Sasaki | |
| 6,316,931 B1 | 11/2001 | Nakagawa et al. | |
| 6,323,634 B1 | 11/2001 | Nakagawa et al. | |
| 6,329,818 B1 | 12/2001 | Tokunaga et al. | |
| 6,331,773 B1 | 12/2001 | Engel | |
| 6,356,068 B1 | 3/2002 | Steiner et al. | |
| 6,392,852 B1 | 5/2002 | Sasaki | |
| 6,404,191 B2 | 6/2002 | Daughton et al. | |
| 6,411,078 B1 | 6/2002 | Nakagawa et al. | |
| 6,424,018 B1 | 7/2002 | Ohtsuka | |
| 6,426,620 B1 | 7/2002 | Taguchi et al. | |
| 6,429,640 B1 | 8/2002 | Daughton et al. | |
| 6,433,981 B1 | 8/2002 | Fletcher et al. | |
| 6,437,558 B2 | 8/2002 | Li et al. | |
| 6,445,171 B2 | 9/2002 | Sandquist et al. | |
| 6,459,255 B1 | 10/2002 | Tamai et al. | |
| 6,462,531 B1 | 10/2002 | Ohtsuka | |
| 6,462,541 B1 | 10/2002 | Wang et al. | |
| 6,501,678 B1 | 12/2002 | Lenssen et al. | |
| 6,542,375 B1 | 4/2003 | Kuitenbrouwer et al. | |
| 6,545,457 B2 | 4/2003 | Goto et al. | |
| 6,566,856 B2 | 5/2003 | Sandquist et al. | |
| 6,583,629 B1 | 6/2003 | Stokes et al. | |
| 6,591,481 B2 | 7/2003 | Shimazawa et al. | |
| 6,642,705 B2 | 11/2003 | Kawase | |
| 6,657,826 B2 | 12/2003 | Shimazawa et al. | |
| 6,667,682 B2 | 12/2003 | Wan et al. | |
| 6,683,448 B1 | 1/2004 | Ohtsuka | |
| 6,721,140 B2 | 4/2004 | Inoue et al. | |
| 6,759,841 B2 | 7/2004 | Goto et al. | |
| 6,769,166 B1 | 8/2004 | Blanchard | |
| 6,781,358 B2 | 8/2004 | Goto et al. | |
| 6,781,359 B2 | 8/2004 | Stauth et al. | |
| 6,791,313 B2 | 9/2004 | Ohtsuka | |
| 6,812,687 B1 | 11/2004 | Ohtsuka | |
| 6,815,944 B2 | 11/2004 | Vig et al. | |
| 6,841,989 B2 | 1/2005 | Goto et al. | |
| 6,970,333 B2 | 11/2005 | Boeve | |
| 6,989,665 B2 | 1/2006 | Goto | |
| 7,026,808 B2 | 4/2006 | Vig et al. | |
| 7,075,287 B1 | 7/2006 | Mangtani et al. | |
| 7,166,807 B2 | 1/2007 | Gagnon et al. | |
| 7,248,045 B2 | 7/2007 | Shoji | |
| 7,259,545 B2 * | 8/2007 | Stauth et al. | 324/117 R |
| 7,336,064 B2 | 2/2008 | Ludwig et al. | |
| 7,358,724 B2 * | 4/2008 | Taylor et al. | 324/260 |
| 7,476,953 B2 * | 1/2009 | Taylor et al. | 257/421 |
| 7,495,624 B2 | 2/2009 | Daalmans | |
| 7,518,354 B2 | 4/2009 | Stauth et al. | |
| 7,746,056 B2 * | 6/2010 | Stauth et al. | 324/117 R |
| 2002/0093332 A1 | 7/2002 | Schroeder et al. | |
| 2002/0180433 A1 | 12/2002 | Van Zon et al. | |
| 2003/0151406 A1 | 8/2003 | Wan et al. | |
| 2004/0023064 A1 | 2/2004 | Ehresmann et al. | |
| 2004/0155644 A1 | 8/2004 | Stauth et al. | |
| 2004/0184196 A1 | 9/2004 | Jayasekara | |
| 2005/0045359 A1 | 3/2005 | Doogue et al. | |
| 2005/0246114 A1 | 11/2005 | Rannow et al. | |
| 2006/0033487 A1 * | 2/2006 | Nagano et al. | 324/117 H |
| 2006/0071655 A1 | 4/2006 | Shoji | |
| 2006/0077598 A1 | 4/2006 | Taylor et al. | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0175674 A1 * | 8/2006 | Taylor et al. | 257/421 |
| 2006/0255797 A1 | 11/2006 | Taylor et al. | |
| 2006/0291106 A1 | 12/2006 | Shoji | |
| 2007/0044370 A1 | 3/2007 | Shoji | |
| 2007/0076332 A1 | 4/2007 | Shoji | |
| 2007/0090825 A1 | 4/2007 | Shoji | |
| 2007/0096716 A1 | 5/2007 | Shoji | |
| 2007/0170533 A1 | 7/2007 | Doogue et al. | |
| 2007/0188946 A1 | 8/2007 | Shoji | |
| 2007/0247146 A1 * | 10/2007 | Stauth et al. | 324/260 |
| 2009/0128130 A1 * | 5/2009 | Stauth et al. | 324/117 R |
| 2009/0315543 A1 | 12/2009 | Guo et al. | |

FOREIGN PATENT DOCUMENTS

| | | |
|---|---|---|
| DE | 42 12 737 C1 | 7/1993 |
| DE | 196 50 078 A1 | 6/1998 |
| DE | 10017374 B4 | 12/2000 |
| DE | 10159607 A1 | 9/2002 |
| DE | 10128150 C1 | 1/2003 |
| DE | 10155423 B4 | 5/2003 |
| DE | 10202287 C1 | 8/2003 |
| DE | 10222395 A1 | 12/2003 |
| DE | 103 14 602 A1 | 10/2004 |
| DE | 102004003369 A1 | 8/2005 |
| DE | 102004009267 B3 | 9/2005 |
| DE | 102004038847 B3 | 9/2005 |
| DE | 102004040079 B3 | 12/2005 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 B4 | 3/2007 |
| DE | 102005052688 A1 | 5/2007 |
| DE | 102006007770 A1 | 8/2007 |
| DE | 102006028698 B3 | 12/2007 |
| DE | 102006046736 B4 | 4/2008 |
| DE | 102006046739 B4 | 8/2008 |
| EP | 0 539 081 A1 | 4/1993 |
| EP | 0 710 850 A2 | 5/1996 |
| EP | 0 710 850 A3 | 5/1996 |
| EP | 1 225 453 A2 | 7/2002 |
| EP | 1 443 332 A1 | 8/2004 |
| EP | 1 691 204 A1 | 8/2006 |
| EP | 1 865 331 A2 | 12/2007 |
| JP | 57187671 | 11/1982 |
| JP | 63/263782 (A) | 10/1988 |
| JP | HEI 02-238372 | 9/1990 |
| JP | HEI 05-010979 | 1/1993 |
| JP | 9-166612 | 6/1997 |
| JP | 2002-82136 | 3/2002 |
| JP | 2004/356338 (A) | 12/2004 |
| WO | WO 03/019216 A1 | 3/2003 |
| WO | WO 03/107018 A1 | 12/2003 |
| WO | WO 2004/109725 A1 | 12/2004 |

| | | |
|---|---|---|
| WO | WO 2006/044031 A1 | 4/2006 |
| WO | WO 2006/083479 A1 | 8/2006 |
| WO | WO 2006/136577 A1 | 12/2006 |
| WO | WO 2007/087121 A2 | 8/2007 |
| WO | WO 2007/087121 A3 | 8/2007 |
| WO | WO 2007/147760 A2 | 12/2007 |

OTHER PUBLICATIONS

Xiao et al.: "An Overview of Integratable Current Sensor Technologies;" IEEE Mar. 2003; 0-7803-7883; pp. 1251-1258.

Sentron A Melexis Company; "Operation and Application of the Sentron CAs-1V-SO Surface Mount Current Sensor;" Current Sensing with the CSA-1V Hall IC, AN_102; Aug. 2004; pp. 1-14.

Mexelis Integrated Systems; "CSA-1V Current Sensor;" www.melexis.com/ProdMain.aspx?nID=614; Aug. 2008; 2 sheets.

PCT Search Report and Written Opinion of the ISA for PCT/US2006/000363 dated Nov. 5, 2006.

PCT International Preliminary Report on Patentability for PCT/US2006/000636 dated Aug. 16, 2007.

Data Sheet; "High-Speed Digital Isolators, AduM1100AR/AduM1100BR;" as published by Analog Devices, Inc.; 2001, pp. 1-12.

Hirota et al.; "Giant Magneto-Resistance Devices;" Springer Series in Surface Sciences, 40; ISBN-10: 3540418199; ISBN-13: 9783540418191 pp. 10-17, 70-77.

Office Action received from European Patent Office dated Dec. 5, 2008 for EP 07716253.5.

Response to Dec. 5, 2008 Office Action dated Jun. 8, 2009 for EP 07716253.5.

Partin, et al.; "Temperature Stable Hall Effect Sensors;" IEEE Sensors Journal, vol. 6, No. 1, Feb. 2006; pp. 106-110.

Pernia et al.; "Characteristics and Design of a Current Sensor Using Multilayer Co/Ni Structures;" IEEE, 1998 pp. 414-419.

PCT Notification Concerning Transmittal of International Preliminary Report on Patentability for PCT/US2007/000093, international filing date of Jan. 4, 2007; 9 pages.

PCT Search Report and Written Opinion of ISA for PCT/US2007/000093 dated Feb. 5, 2008.

Taylor, et al.; "A Spin-Valve Based SOIC8 Current Sensor;" Allegro Microsystems, Inc. internal document; Aug. 17, 2006; pp. 1-5.

Takenaga et al.; "High-Temperture Operations of Rotation Angle Sensors with Spin-Valve-Type Magnetic Tunnel Junctions;" IEEE Transactions on Magnetics; vol. 41, No. 10; Oct. 2005; pp. 3628-3630.

EP Official Communication dated Dec. 5, 2008 for EP Pat. App. No. 07 716 253.5 filed on Jul. 10, 2008; 3 sheets.

EP Response to Official Communication dated Dec. 5, 2008 and filed on Jun. 8, 2009 EP Pat. App. No. 07 716 253.5 filed on Jul. 10, 2008; 15 sheets.

Office Action/Restriction Requirement dated May 15, 2008 for U.S. Appl. No. 11/335,944, filed Jan. 20, 2006; 5 sheets.

Response/Amendment to Restriction Requirement dated May 15, 2008 and filed on May 30, 2008 for U.S. Appl. No. 11/335,944, filed Jan. 20, 2006; 1 sheet.

Office Action dated Apr. 6, 2009 for U.S. Appl. No. 11/335,944, filed Jan. 20, 2006; 18 sheets.

Response/Amendment to Office Action dated Apr. 6, 2009 and filed on Jul. 6, 2009 for U.S. Appl. No. 11/335,944, filed Jan. 20, 2006; 17 sheets.

Office Action dated Nov. 16, 2009 for U.S. Appl. No. 11/335,944, filed Jan. 20, 2006; 16 sheets.

Response/Amendment to Office Action dated Nov. 16, 2009 and filed on Dec. 23, 2009 for U.S. Appl. No. 11/335,944, filed Jan. 20, 2006; 19 sheets.

Request for Continued Examination and Statement Concerning Common Ownership filed on Dec. 23, 2009 for U.S. Appl. No. 11/335,944, filed Jan. 20, 2006; 2 sheets.

Notice of Allowance dated Jan. 28, 2010 for U.S. Appl. No. 11/335,944, filed Jan. 20, 2006; 6 sheets.

Request for Continued Examination dated Feb. 23, 2010 for U.S. Appl. No. 11/335,944, filed Jan. 20, 2006; 1 sheet.

Notice of Allowance dated Mar. 23, 2010 for U.S. Appl. No. 11/335,944, filed Jan. 20, 2006; 6 sheets.

Amendment Under 37 C.F.R. §1.312 filed on May 20, 2010 Notice of Allowance dated Jan. 28, 2010 for U.S. Appl. No. 11/335,944, filed Jan. 20, 2006; 7 sheets.

Image File Wrapper downloaded on Jul. 12, 2010 for U.S. Appl. No. 12/792,245, filed Jun. 2, 2010; 91 sheets.

"Utilization of GMR Materials. Analog Bridge Output Devices;" pp. 1-3; NVE Corporation on website: www.nve.com/technical/explinations//Bridge.html.; Feb. 22, 2010; 3 sheets.

* cited by examiner

ARRANGEMENTS FOR A CURRENT SENSING CIRCUIT AND INTEGRATED CURRENT SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to current sensing circuits and, more particularly, to current sensing circuits having respective integrated current sensors.

BACKGROUND OF THE INVENTION

As is known in the art, one type of conventional current sensor uses a Hall effect element, which generates a voltage in response to a magnetic field associated with a current passing through a conductor. Typical current sensors of this type include a Hall effect element mounted on a dielectric material, for example a circuit board. In some applications, a ferrous core (magnetic flux concentrator) is used in proximity to the Hall effect element.

Another type of current sensor uses a magnetoresistance element, which changes resistance in response to a magnetic field associated with a current passing through a conductor. A fixed electrical current is directed through the magnetoresistance element, thereby generating a voltage output signal proportional to the magnetic field. Some conventional current sensors of this type use an anisotropic magnetoresistance (AMR) element mounted on a dielectric material, for example a circuit board.

Various parameters characterize the performance of current sensors, including sensitivity and linearity. Sensitivity is related to a change in the resistance of the magnetoresistance element or a change in output voltage from the Hall effect element in response to a change in magnetic field. Linearity is related to the degree to which the resistance of the magnetoresistance element or the output voltage from the Hall effect element varies in direct linear proportion to the magnetic field.

Another parameter that can characterize a current sensor is an ability to withstand at least a predetermined breakdown voltage between the current sensor and a conductor near which the current sensor is disposed in order to measure a current in the conductor.

There can be a tradeoff between current sensor sensitivity and the above-described breakdown voltage. Namely, in order to achieve high sensitivity, it is desirable that the current sensor, and, in particular, a current (magnetic field) sensing element within the current sensor, be disposed proximate to and as close to the conductor as possible. However, close proximity tends to reduce the breakdown voltage.

Various types of magnetic field sensing elements (e.g., Hall effect elements and magnetoresistance elements), which are used in current sensors, are known to have different characteristics, including, but not limited to, different sensitivities, different linearities, and also different hysteresis characteristics in response to a magnetic field. It is also known that many types of magnetoresistance elements have a higher sensitivity than a Hall effect element. It is also known that a particular type of magnetic field sensing element, for example, a Hall effect element, can have a substantially different sensitivity when the substrate (i.e., sensitive layer) is comprised of different materials, for example, Silicon (Si) and Gallium Arsenide (GaAs).

It would be desirable to provide a current sensor having a both a relatively high sensitivity and also a relatively high breakdown voltage.

SUMMARY OF THE INVENTION

In accordance with one aspect of the present invention, an electronic circuit for sensing a current includes a circuit board having first and second major opposing surfaces and a current conductor for carrying the current. The current conductor includes a circuit trace disposed upon the circuit board. The electronic circuit also includes an integrated circuit disposed upon and electrically coupled to the circuit board at a position so as to straddle the current conductor. The integrated circuit includes a magnetoresistance element for sensing a magnetic field associated with the current.

With this arrangement, the electronic circuit has a relatively high sensitivity to the current, in particular as compared to the sensitivity that would otherwise be achieved with a Hall effect element in place of the magnetoresistance element.

It will be appreciated that the current conductor can both carry a current and also have an associated voltage. In some arrangements, the current conductor is disposed upon the second surface of the circuit board and the integrated circuit is disposed over the first surface of the circuit board. With this particular arrangement, the electronic circuit has both a relatively high sensitivity to the current, and also has a particular high breakdown voltage to the voltage upon the current conductor.

In accordance with another aspect of the present invention, an electronic circuit for sensing a current includes a circuit board having first and second major opposing surfaces and a current conductor for carrying the current. The current conductor comprises a circuit trace. The electronic circuit also includes an integrated circuit disposed upon and electrically coupled to the circuit board. The integrated circuit includes a Hall effect element for sensing a magnetic field associated with the current. The current conductor is disposed upon the second surface of the circuit board and the integrated circuit is disposed upon the first surface of the circuit board.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe an electronic component that is responsive to and can be used to measure magnetic fields. The magnetic field sensing element can be of a type including, but not limited to, a Hall effect element and a magnetoresistance element. The Hall effect element can be a horizontal type or a vertical type. The magnetoresistance element can be of a type including, but not limited to, a giant magnetoresistance (GMR) element, an anisotropic magnetoresistance (AMR) element, a magnetic tunnel junction (MJT) element, and a tunneling magnetoresistance (TMR) element.

As used herein, the term "magnetic field sensor" is used to describe an electronic circuit, which includes a magnetic field sensing element, and which is responsive to and can be used to measure a magnetic field. As used herein, the term "current sensor" is used to describe an electronic integrated circuit, which includes a magnetic field sensing element, and which is responsive to and can be used to measure a current in a conductor.

It will be understood herein that a current in a conductor generates a magnetic field disposed about the direction of current. Therefore, the magnetic field sensing element as used in a current sensor can be used to measure the current flowing in a conductor.

As used herein, the term "circuit board" is used to describe printed circuit boards (PCBS), for example, fiberglass circuit boards with conductive circuit traces, and also ceramic substrates with conductive traces.

Figure 1:
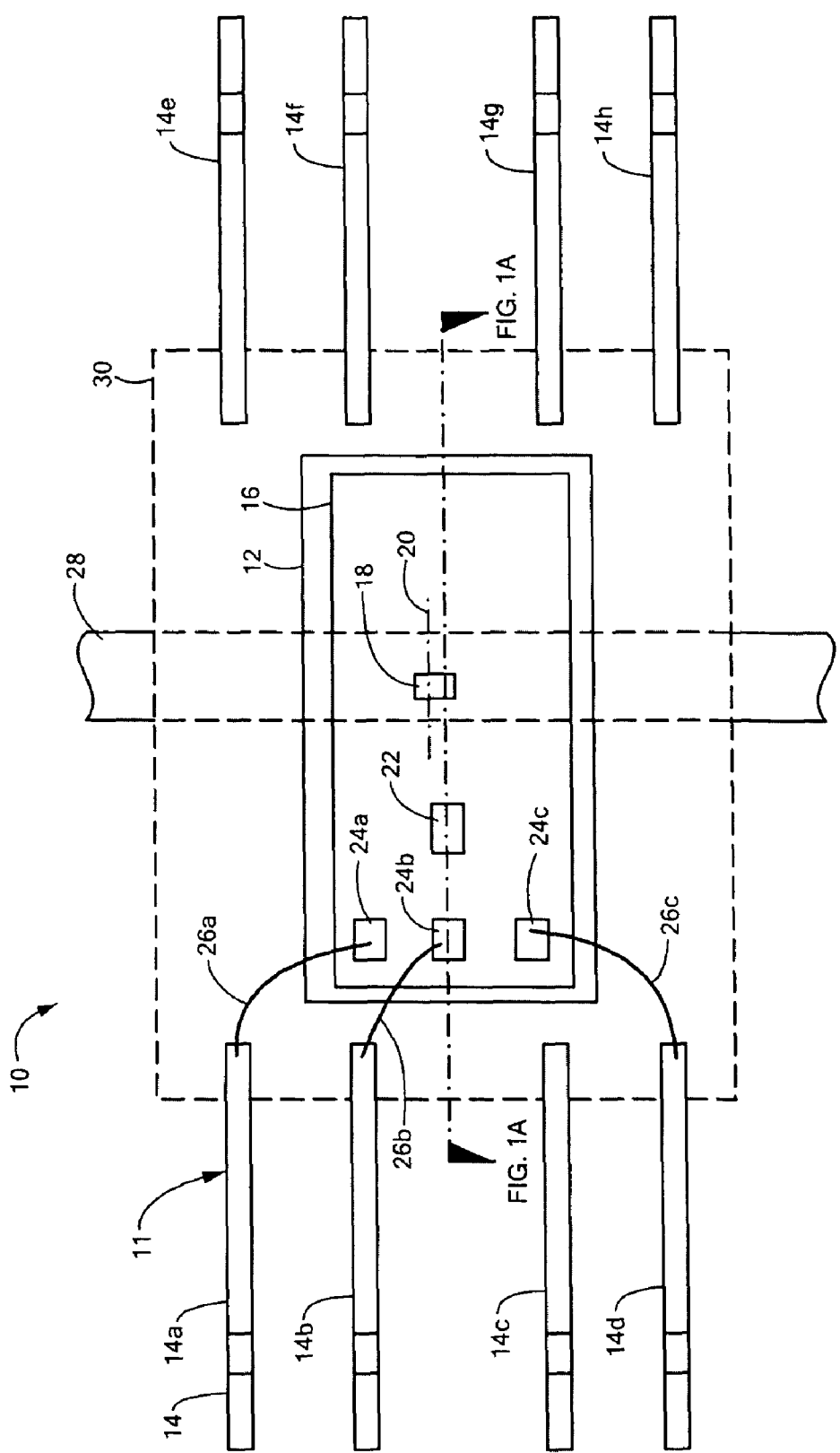
FIG. 1 is a pictorial showing an electronic circuit including an integrated circuit current sensor having magnetic field sensing element disposed over a surface of a substrate and also including a current conductor.
Figure 1A:
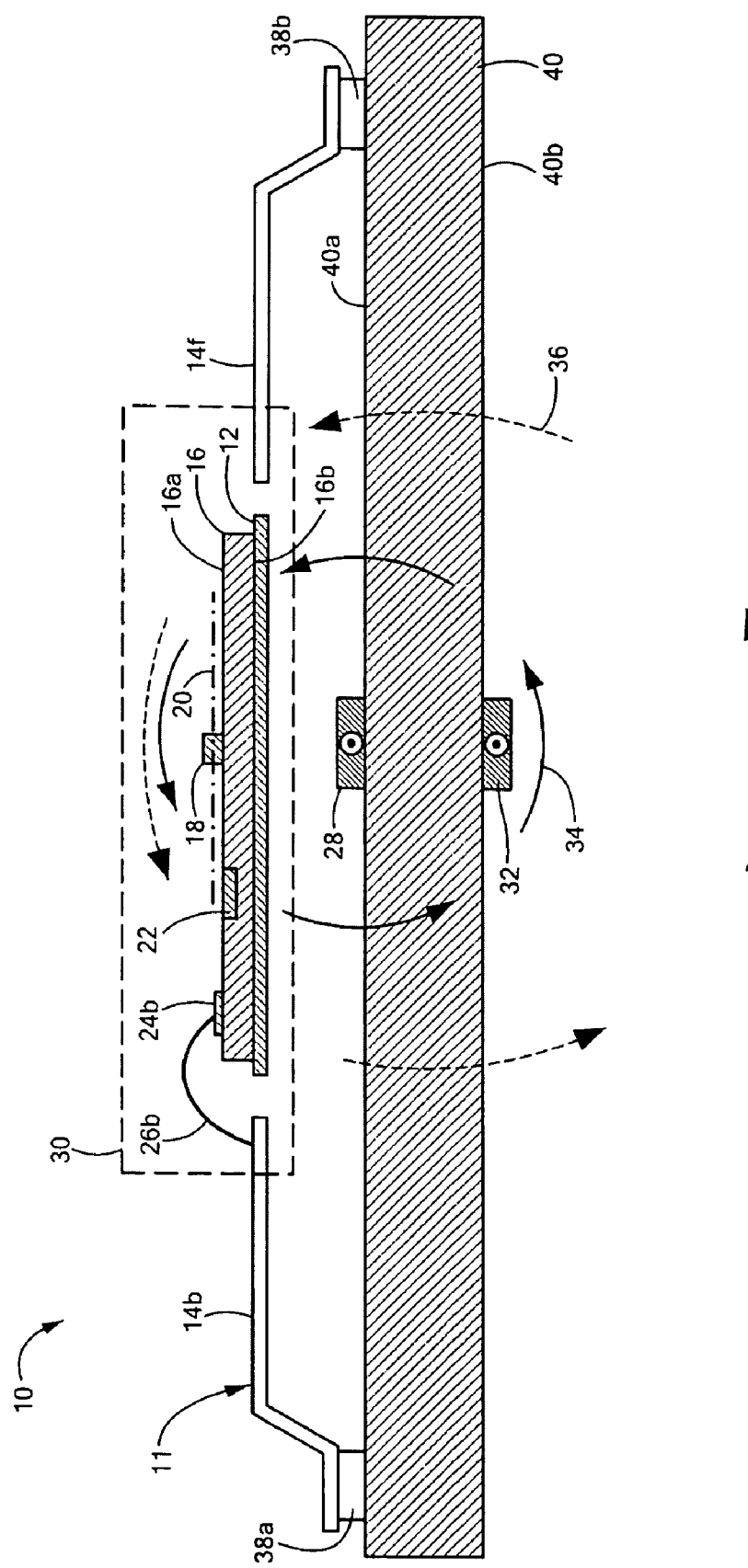
FIG. 1A is a cross-sectional view of the electronic circuit of FIG. 1.

Referring to FIGS. 1 and 1A, in which like elements are shown having like reference designations, an electronic circuit 10 includes an integrated circuit current sensor 11 disposed over and straddling one or both of a first current conductor 28 disposed on a first surface 40a of a circuit board 40, the first surface 40a proximate to the current sensor 11, or a second current conductor 32 disposed over a second surface 40b of the circuit board 40, the second surface 40b distal from the current sensor 11. The current sensor 11 includes a lead frame 14 having a base plate 12 and associated leads 14a-14h.

The current sensor 11 also includes a substrate 16 having first and second opposing surfaces 16a, 16b, respectively. The substrate 16 is disposed over the lead frame base plate 12 such that the second surface 16b of the substrate 16 is above the base plate 12 and the first surface 16a of the substrate 16 is above the second surface 16b of the substrate 16.

The current sensor 11 also includes a magnetic field sensing element 18 disposed over the first surface 16a of the substrate 16.

In one particular embodiment, the magnetic field sensing element 18 is a magnetoresistance element, for example, a selected one of a giant magnetoresistance (GMR) element or an anisotropic magnetoresistance (AMR) element. In another particular embodiment, the magnetic field sensing element 18 is a Hall effect element. However, it will be understood that a magnetoresistance element generally has a higher sensitivity than a Hall effect element, and therefore, the electronic circuit 10, for which the magnetic field sensing element 18 is somewhat far from the current conductor 28 as shown can achieve a higher sensitivity than the electronic circuit 10, for which the magnetic field sensing element 18 is a Hall effect element.

Furthermore, it will be appreciated that a magnetoresistance element generally has a maximum response axis 20, which is parallel to a surface, for example, the first surface 16a of the substrate 16. In contrast, most types of Hall effect elements have a maximum response axis perpendicular to the first surface 16a of the substrate 16.

The substrate 16 (which, for a Hall effect element, can be a sensing layer) can be comprised of a variety of materials including, but not limited to, Si, GaAs, InP, InSb, InGaAs, InGaAsP, SiGe, ceramic, or glass. In one particular embodiment, the substrate 16 is comprised of Silicon (Si).

The current sensor 11 can also include at least one electronic component 22 disposed on the first surface 16a of the substrate 16. The electronic component 22 can include, but is not limited to, a passive electronic component, for example, a resistor, capacitor, or inductor, and an active electronic component, for example, a transistor, an amplifier, or another integrated circuit.

The substrate 16 can also include a plurality of bonding pads, of which bonding pads 24a-24c are representative. Bond wires 26a-26c can couple the substrate 16 to leads, for example to leads 14a, 14b, 14d. However, it will be appreciated that the integrated circuit 11 can have more than three or fewer than three such couplings.

With an arrangement as shown, it will be recognized that a body 30, e.g., plastic, can be used to encase the substrate 16.

It should be appreciated that various insulating layers (not shown) can be used to electrically isolate portions of the current sensor 11 from other portions of the current sensor 11. For example, an insulating layer (not shown) can be disposed between the first surface 16a of the substrate 16 and the magnetic field sensing element 18. Also, an insulating layer (not shown) can be disposed between the second surface 16b of the substrate 16 and the base plate 12.

While the substrate 16 is shown to be conventionally mounted to the base plate 12, i.e., with the first surface 16a of the substrate 16 facing away from the base plate 12, in other arrangements, the substrate 16 can be flipped in a flip-chip arrangement relative to the base plate 12. In these arrangements, the first surface 16a of the substrate 16 is proximate to the base plate 12 and coupled to the leads 14a-14h with a selected one of a solder ball, a gold bump, a eutectic or high lead solder bump, a no-lead solder bump, a gold stud bump, a polymeric conductive bump, a conductive paste, or a conductive film.

In operation, in response to a current flowing through the first current conductor 28, a magnetic flux represented by lines 34 is generated. For embodiments in which the magnetic field sensing element 18 is a magnetoresistance element, the magnetic flux represented by the lines 34 passes by and through the magnetic field sensing element 18 in a direction substantially parallel to the maximum response axis 20 of the magnetic field sensing element 18, and thus, the magnetic field sensing element 18 is responsive to the current flowing in the current conductor 28.

For embodiments in which the magnetic field sensing element 18 is a Hall effect element, which, as described above, can have maximum response axis substantially perpendicular to the first surface 16a of the substrate 16, the magnetic field sensing element 18 can be disposed to the right or left of the position shown, so that the magnetic flux represented by the lines 34 passes more vertically with respect to the first surface 16a of the substrate 16 and more vertically through the magnetic field sensing element 18.

In some other embodiments in which the magnetic field sensing element 18 is a Hall effect element, the entire current sensor 11 is disposed to the right or left of the current conductor 28 or 32 so that the current sensor 11 does not straddle the current conductor 28 or 32.

The second current conductor 32 disposed on a second surface 40b of the circuit board 40 opposing the first surface 40a can be used in place of or in addition to the first current conductor 28 so that the current sensor 11 senses a current passing through the current second conductor 32 instead of or in addition to a current passing through the first current conductor 28. A magnetic flux represented by lines 36 passes by and through the magnetic field sensing element 18 in a direction substantially parallel to the maximum response axis 20 of the magnetic field sensing element 18, and thus, the magnetic field sensing element 18 is responsive to the current flowing in the second current conductor 32. However, it will be understood that, since the second current conductor 32 is further from the magnetic field sensing element 18 than the first current conductor 28, the magnetic field sensing element 18, and therefore, the current sensor 11 is less sensitive to the current flowing through the second current conductor 32 than to the current flowing through the first current conductor 28. Therefore, for arrangements using the second current conductor 32 rather than the first current conductor 28, it is advantageous that the magnetic field sensing element 18 be a magnetoresistance element, which has higher sensitivity than a Hall effect element.

The electronic circuit 10 having the second current conductor 32 on the opposite side of the circuit board 40 from the integrated circuit 11, provides a particularly high breakdown voltage (or electrical isolation) between the second current conductor 32 and the integrated circuit 11. This is true since most conventional circuit boards 40, for example, epoxy glass circuit boards, are insulators having a high breakdown voltage.

It will be apparent that the current sensor 11 straddles the first conductor 28 and also straddles the second conductor 32. As used herein, the term "straddles" is used to describe an arrangement, wherein a plane perpendicular to the circuit board 40 and passing through a distal end of the leads, e.g., the leads 14a-14d, on one side of the current sensor 10 and another plane perpendicular to the circuit board 40 and passing through a distal end of the leads, e.g., the leads 14a-14d, on the other side of the current sensor 10, are on opposite sides of the conductor 28 or 32.

Figure 2:
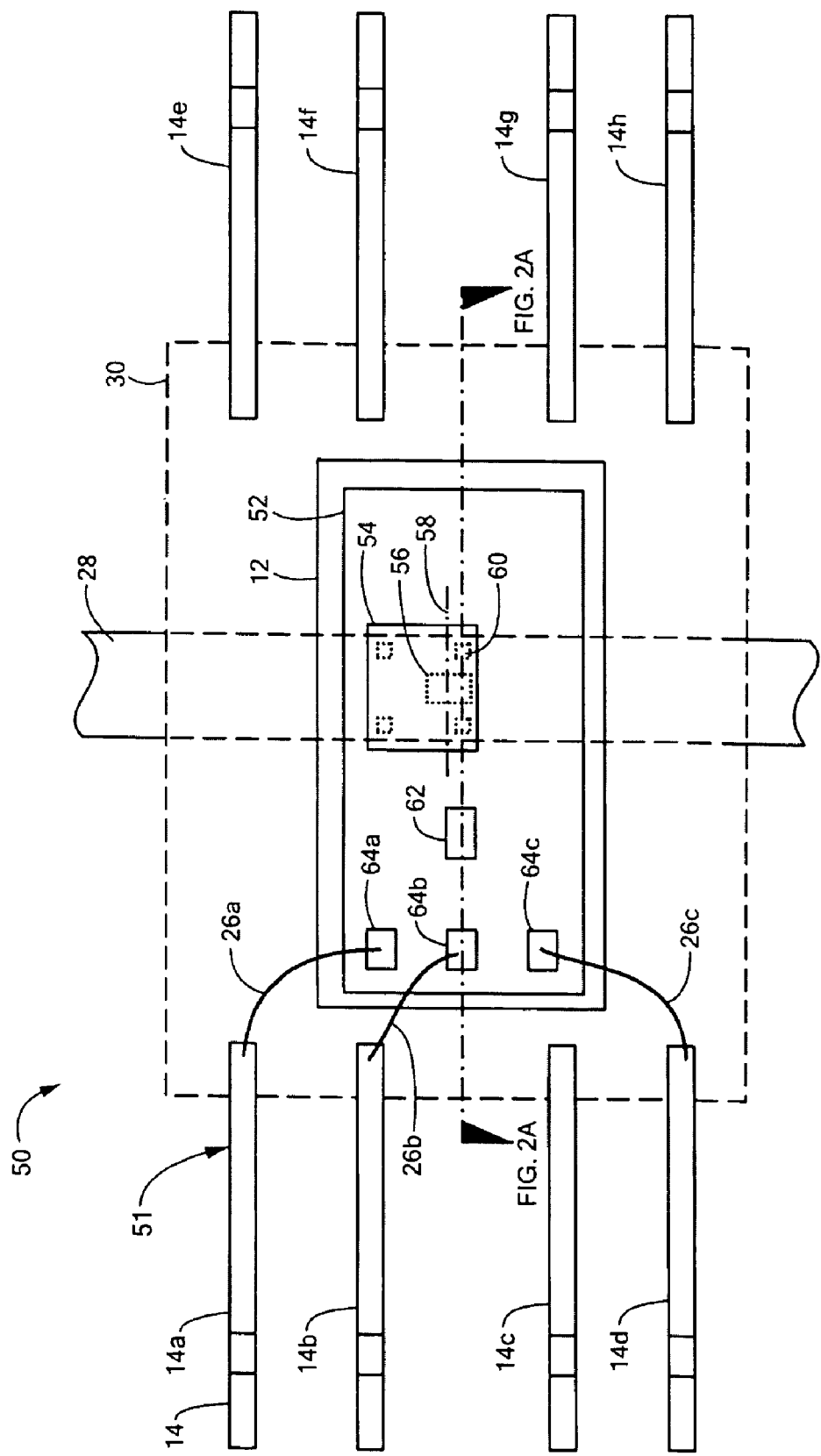
FIG. 2 is a pictorial showing an electronic circuit including an integrated circuit current sensor having first and second substrates, a magnetic field sensing element disposed over a surface of the second substrate, and also including a current conductor.
Figure 2A:
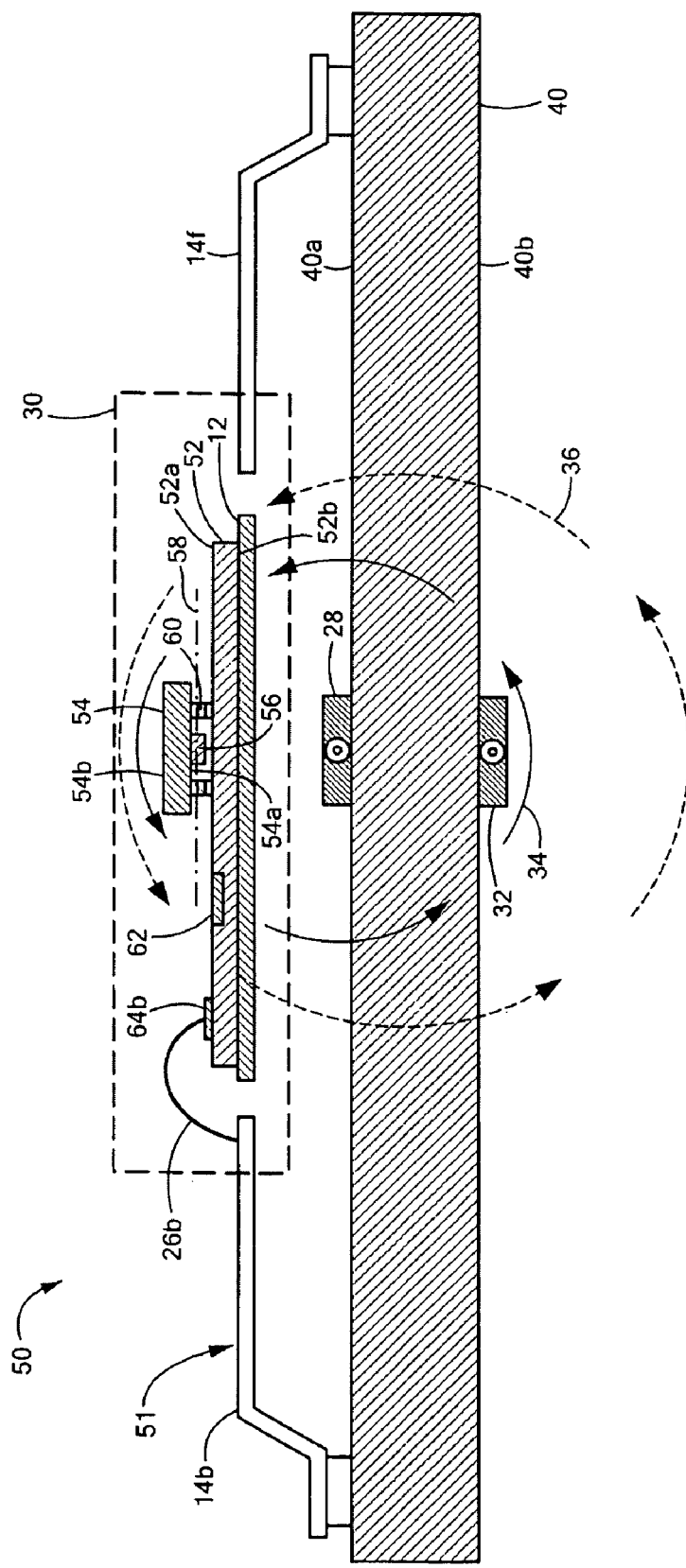
FIG. 2A is a cross-sectional view of the electronic circuit of FIG. 2.

Referring now to FIGS. 2 and 2A, in which like elements are shown having like reference designators, and in which like elements of FIGS. 1 and 1A are also shown having like reference designators, an electronic circuit 50 includes an integrated circuit current sensor 51. The electronic circuit 50 includes aspects similar to and functions in a way similar to the electronic circuit 10 of FIGS. 1 and 1A.

The current sensor 51 includes a first substrate 52 having first and second opposing surfaces 52a, 52b, respectively. The first substrate 52 is disposed upon the base plate 12 such that the second surface 52b of the first substrate 52 is above the base plate 12 and the first surface 52a of the first substrate 52 is above the second surface 52b of the first substrate 52.

The integrated circuit 51 also includes a second substrate 54 having first and second opposing surfaces 54a, 54b, respectively. The first substrate 52 and the second substrate 54 are coupled such that the first surface 54a of the second substrate 54 is above the first surface 52a of the first substrate 52 and the second surface 54b of the second substrate 54 is above the first surface 54a of the second substrate 54. It will be apparent that the second substrate 54 is disposed in a flip-chip arrangement with the first substrate 52.

The first and second substrates 52, 54, respectively, can be comprised of a variety of materials including, but not limited to, Si, GaAs, InP, InSb, InGaAs, InGaAsP, SiGe, ceramic, or glass. The first and second substrates 52, 54, respectively, can be comprised of the same material or of different materials.

The first surface 54a of the second substrate 54 can be coupled to the first surface 52a of the first substrate 52 with bonds, of which a bond 60 is but one example. The bonds (e.g., 60) can be a selected one of a solder ball, a gold bump, a eutectic or high lead solder bump, a no-lead solder bump, a gold stud bump, a polymeric conductive bump, a conductive paste, or a conductive film.

The current sensor 51 can also include at least one electronic component 62 disposed on the first surface 52a of the first substrate 52. The electronic component 62 can include, but is not limited to, a passive electronic component, for example, a resistor, capacitor, or inductor, and an active electronic component, for example, a transistor, an amplifier, or another integrated circuit.

The current sensor 51 also includes a magnetic field sensing element 56 disposed over the first surface 54a of the second substrate 54. The magnetic field sensing element 56 can be the same as or similar to the magnetic field sensing element 18 of FIGS. 1 and 1A. The magnetic field sensing element 56 can have a maximum response axis 58, which is essentially parallel to the first surface 54a of the second substrate 54. The current sensor 51 can straddle the current conductor 28 or 32.

For embodiments in which the magnetic field sensing element 56 is a Hall effect element, which can have maximum response axis substantially perpendicular to the first surface 54a of the second substrate 54, the magnetic field sensing element 56 can be disposed to the right or left of the position shown, so that the magnetic flux represented by the lines 34 passes more vertically with respect to the first surface 54a of the second substrate 54 and more vertically through the magnetic field sensing element 56.

In some other embodiments in which the magnetic field sensing element 56 is a Hall effect element, the entire current sensor 51 is disposed to the right or left of the current conductor 28 or 32 so that the current sensor 51 does not straddle the current conductor 28 or 32.

The current sensor 51 can also include a plurality of bonding pads, of which bonding pads 64a-64c are representative. Bond wires 26a-26c can couple the first substrate 52 to the leads, for example, leads 14a, 14b, 14d of the lead frame 14.

It should be appreciated that various insulating layers can be used to electrically isolate portions of the current sensor 51 from other portions of the current sensor 51. For example, an insulating layer (not shown) can be disposed between the first surface 52a of the first substrate 52 and the first surface 54a of the second substrate 54. Also, an insulating layer (not shown) can be disposed between the first surface 54a of the second substrate 54 and the magnetic field sensing element 56.

It will be apparent that the current sensor 51 straddles the first conductor 28 and also straddles the second conductor 32.

Figure 3:
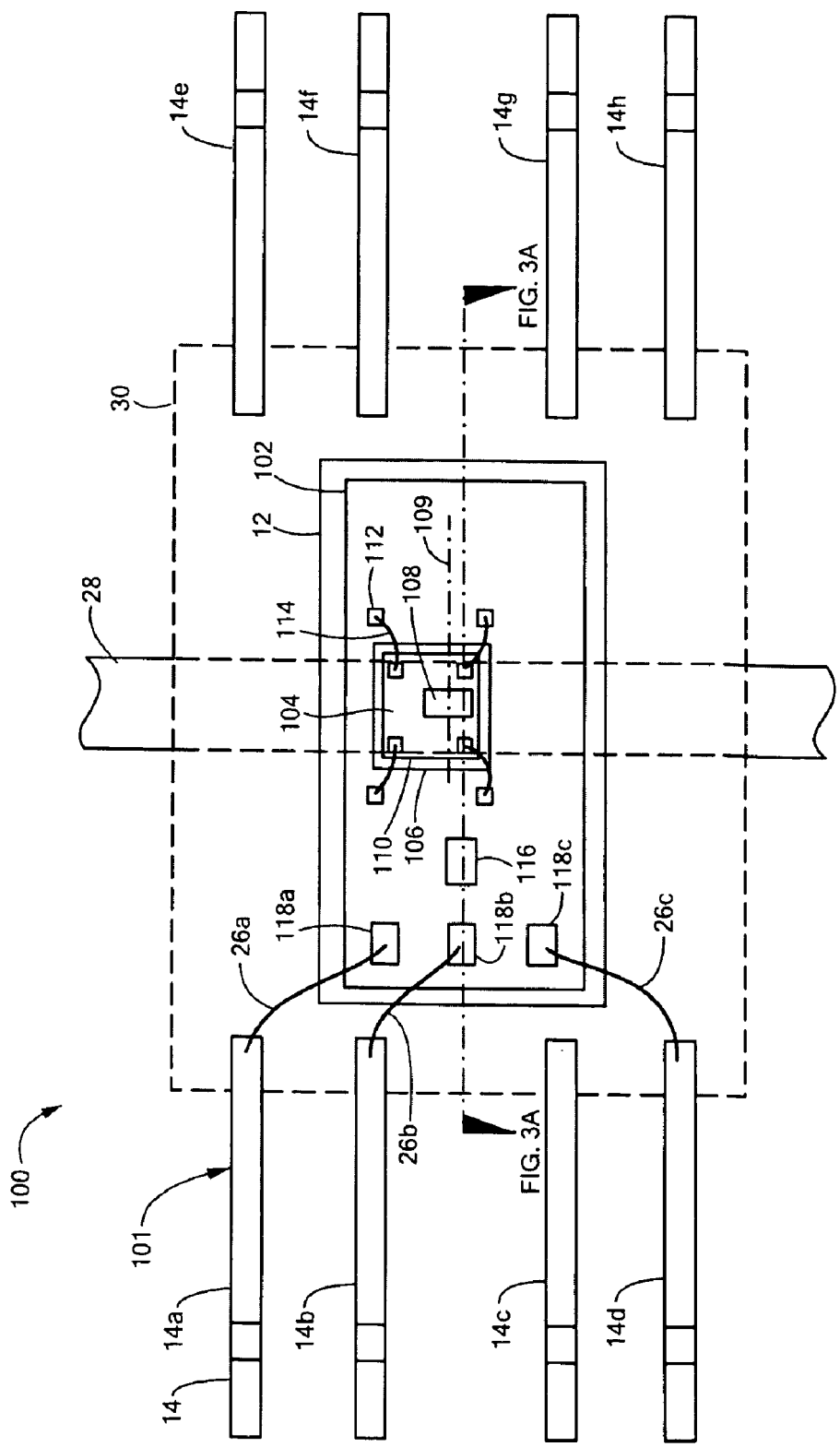
FIG. 3 is a pictorial showing another electronic circuit including an integrated circuit current sensor having first and second substrates, a magnetic field sensing element disposed over a surface of the second substrate, and also including a current conductor.
Figure 3A:
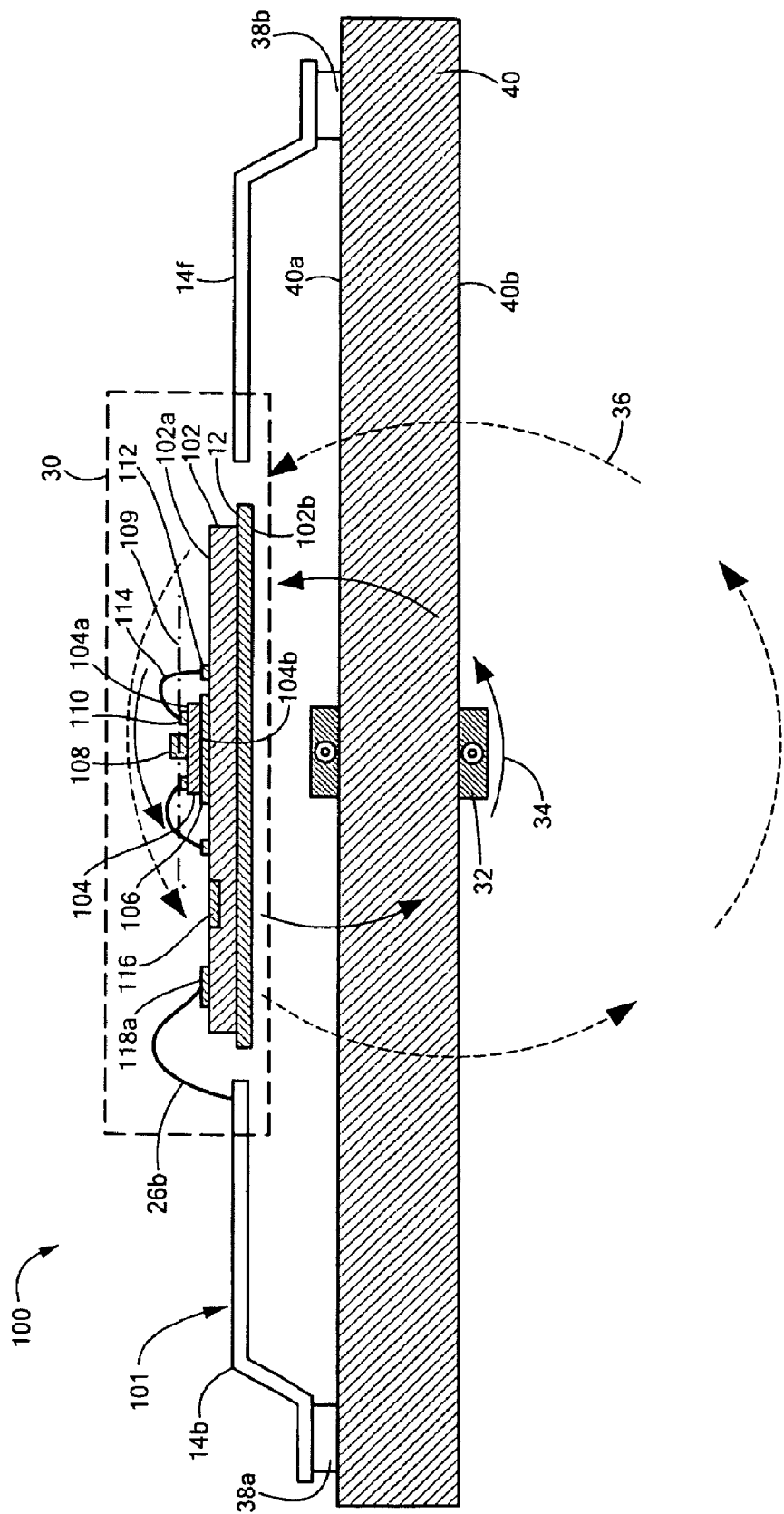
FIG. 3A is a cross-sectional view of the electronic circuit of FIG. 3.

Referring now to FIGS. 3 and 3A, in which like elements are shown having like reference designators, and in which like elements of FIGS. 1 and 1A are also shown having like reference designators, an electronic circuit 100 includes an integrated circuit current sensor 101. The electronic circuit 100 includes aspects similar to and functions in a way similar to the electronic circuit 10 of FIGS. 1 and 1A.

The current sensor 101 includes a first substrate 102 having first and second opposing surfaces 102a, 102b, respectively. The first substrate 102 is disposed upon the base plate 12 such that the second surface 102b of the first substrate 102 is above the base plate 12 and the first surface 102a of the first substrate 102 is above the second surface 102b of the first substrate 102.

The integrated circuit 101 also includes a second substrate 104 having first and second opposing surfaces 104a, 104b, respectively. The first substrate 102 and the second substrate 104 are coupled such that the second surface 104b of the second substrate 104 is above the first surface 102a of the first substrate 102 and the first surface 104a of the second substrate 104 is above the second surface 104b of the second substrate 104.

In some embodiments, and insulator 106 can be disposed between the first and second substrates 102, 104, respectively. In some embodiments, the insulator 106 is an epoxy substance also providing attachment of the second substrate 104 to the first substrate 102.

The first and second substrates 102, 104, respectively, can be comprised of a variety of materials including, but not limited to, Si, GaAs, InP, InSb, InGaAs, InGaAsP, SiGe, ceramic, or glass. The first and second substrates 102, 104, respectively, can be comprised of the same material or of different materials.

The first surface 104a of the second substrate 104 can be coupled to the first surface 102a of the first substrate 102 with wire bonds, of which a wire bond 114 between bonding pads 110 and 112 is but one example.

The current sensor 101 can also include at least one electronic component 116 disposed on the first surface 102a of the first substrate 102. The electronic component 116 can include, but is not limited to, a passive electronic component, for example, a resistor, capacitor, or inductor, and an active electronic component, for example, a transistor, an amplifier, or another integrated circuit.

The current sensor 101 also includes a magnetic field sensing element 108 disposed over the first surface 104a of the second substrate 104. The magnetic field sensing element 108 can be the same as or similar to the magnetic field sensing element 18 of FIGS. 1 and 1A. The magnetic field sensing element 108 has a maximum response axis 109, which is essentially parallel to the first surface 104a of the second substrate 104. The current sensor 101 can straddle the current conductor 28 and/or 32.

For embodiments in which the magnetic field sensing element 108 is a Hall effect element, which can have maximum response axis substantially perpendicular to the first surface 104a of the second substrate 104, the magnetic field sensing element 108 can be disposed to the right or left of the position shown, so that the magnetic flux represented by the lines 34 passes more vertically with respect to the first surface 104a of the second substrate 104 and more vertically through the magnetic field sensing element 108.

In some other embodiments in which the magnetic field sensing element 108 is a Hall effect element, the entire current sensor 101 is disposed to the right or left of the current conductor 28 or 32 so that the current sensor 101 does not straddle the current conductor 28 or 32.

The current sensor 101 can also include a plurality of bonding pads, of which bonding pads 118a-118c are representative. Bond wires 26a-26c can couple the first substrate 102 to the leads, for example, leads 14a, 14b, 14d of the lead frame 14.

It should be appreciated that various insulating layers can be used to electrically isolate portions of the current sensor 101 from other portions of the current sensor 101. For example, an insulating layer 106 can be disposed between the first surface 102a of the first substrate 102 and the second surface 104b of the second substrate 104. Also, an insulating layer (not shown) can be disposed between the first surface 104a of the second substrate 104 and the magnetic field sensing element 108.

It will be apparent that the current sensor 101 straddles the first conductor 28 and also straddles the second conductor 32.

Figure 4:
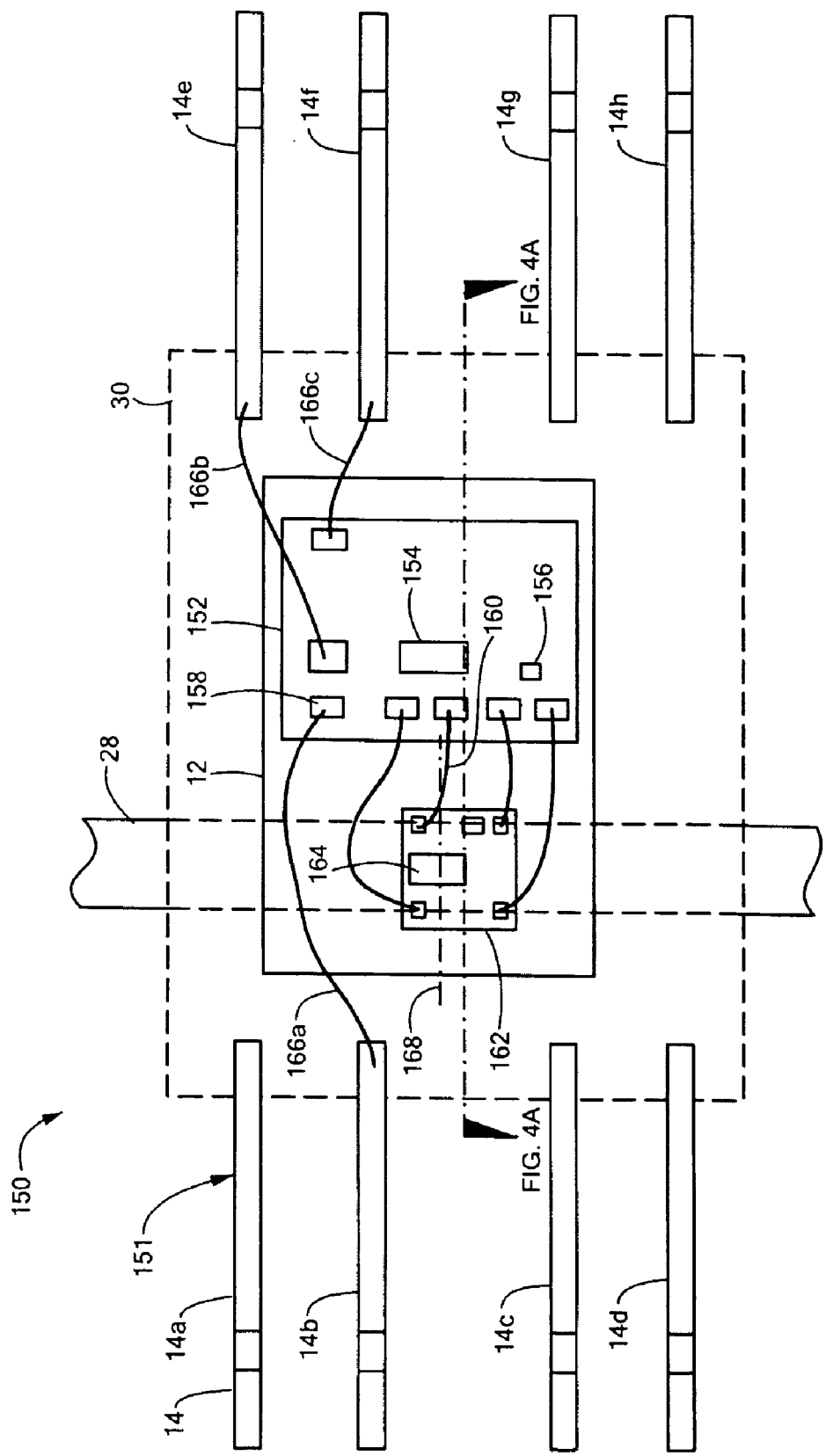
FIG. 4 is a pictorial showing another electronic circuit including an integrated circuit current sensor having first and second substrates, a magnetic field sensing element disposed over a surface of the second substrate, and also including a current conductor.
Figure 4A:
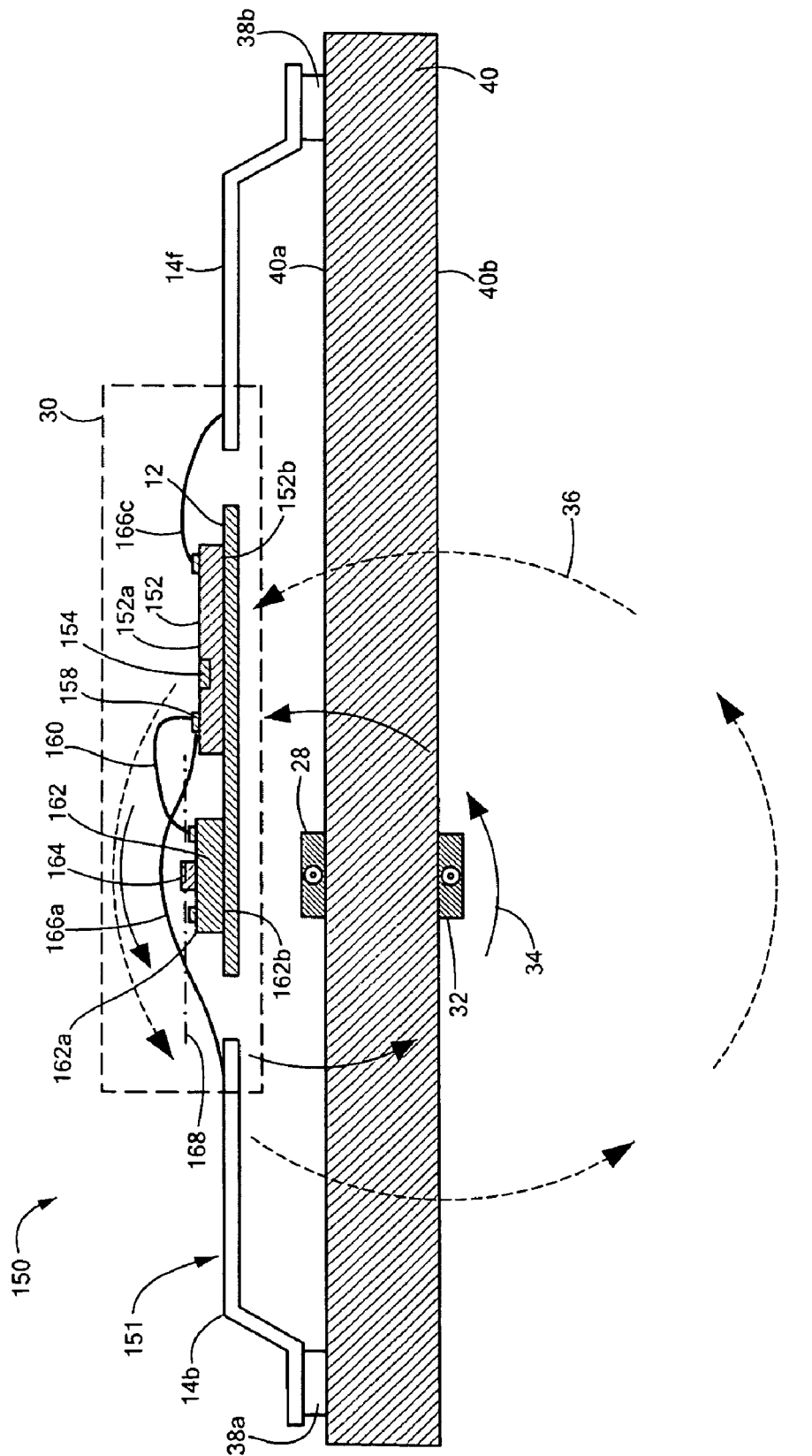
FIG. 4A is a cross-sectional view of the electronic circuit of FIG. 4.

Referring now to FIGS. 4 and 4A, in which like elements are shown having like reference designators, and in which like elements of FIGS. 1 and 1A are also shown having like reference designators, an electronic circuit 150 includes an integrated circuit current sensor 151. The electronic circuit 150 includes aspects similar to and functions in a way similar to the electronic circuit 10 of FIGS. 1 and 1A.

The current sensor 151 includes a first substrate 152 having first and second opposing surfaces 152a, 152b, respectively. The first substrate 152 is disposed over the base plate 12 such that the second surface 152b of the first substrate 152 is above the base plate 12 and the first surface 152a of the first substrate 152 is above the second surface 152b of the first substrate 152.

The integrated circuit 151 also includes a second substrate 162 having first and second opposing surfaces 162a, 162b, respectively. The second substrate 162 is coupled to the base plate 12 such that the second surface 162b of the second substrate 162 is above the base plate 12 and the first surface 162a of the second substrate 162 is above the second surface 162b of the second substrate 162.

The first and second substrates 152, 162, respectively, can be comprised of a variety of materials including, but not limited to, Si, GaAs, InP, InSb, InGaAs, InGaAsP, SiGe, ceramic, or glass. The first and second substrates 152, 162, respectively, can be comprised of the same material or of different materials.

The first surface 162a of the second substrate 162 can be coupled to the first surface 152a of the first substrate 152 with wire bonds, of which a wire bond 160 is but one example.

The current sensor 151 can also include at least one electronic component 154 disposed on the first surface 152a of the first substrate 152. The electronic component 154 can include, but is not limited to, a passive electronic component, for example, a resistor, capacitor, or inductor, and an active electronic component, for example, a transistor, an amplifier, or another integrated circuit.

The current sensor 151 also includes a magnetic field sensing element 164 disposed over the first surface 162a of the second substrate 162. The magnetic field sensing element 164 can be the same as or similar to the magnetic field sensing element 18 of FIGS. 1 and 1A. The magnetic field sensing element 164 has a maximum response axis 168, which is essentially parallel to the first surface 162a of the second substrate 162. The current sensor 151 can straddle the current conductor 28 and/or 32.

For embodiments in which the magnetic field sensing element 164 is a Hall effect element, which can have maximum response axis substantially perpendicular to the first surface 162a of the second substrate 162, the magnetic field sensing element 164 can be disposed to the right or left of the position shown, so that the magnetic flux represented by the lines 34 passes more vertically with respect to the first surface 162a of the second substrate 162 and more vertically through the magnetic field sensing element 164.

In some other embodiments in which the magnetic field sensing element 164 is a Hall effect element, the entire current sensor 151 is disposed to the right or left of the current conductor 28 or 32 so that the current sensor 151 does not straddle the current conductor 28 or 32.

The current sensor 151 can also include a plurality of bonding pads, of which a bonding pad 158 is but one example. Bond wires, for example, bond wires 166a-166c, can couple the first substrate 152 to the leads, for example, leads 14a, 14e, 14f of the lead frame 14.

It should be appreciated that various insulating layers can be used to electrically isolate portions of the current sensor 151 from other portions of the current sensor 151. For example, an insulating layers (not shown) can be disposed between the second surfaces 152b, 162b of the first and second substrates 152, 162, respectively, and the base plate 12. Also, an insulating layer (not shown) can be disposed between the first surface 162a of the second substrate 162 and the magnetic field sensing element 164.

It will be apparent that the current sensor 151 straddles the first conductor 28 and also straddles the second conductor 32.

Figure 5:
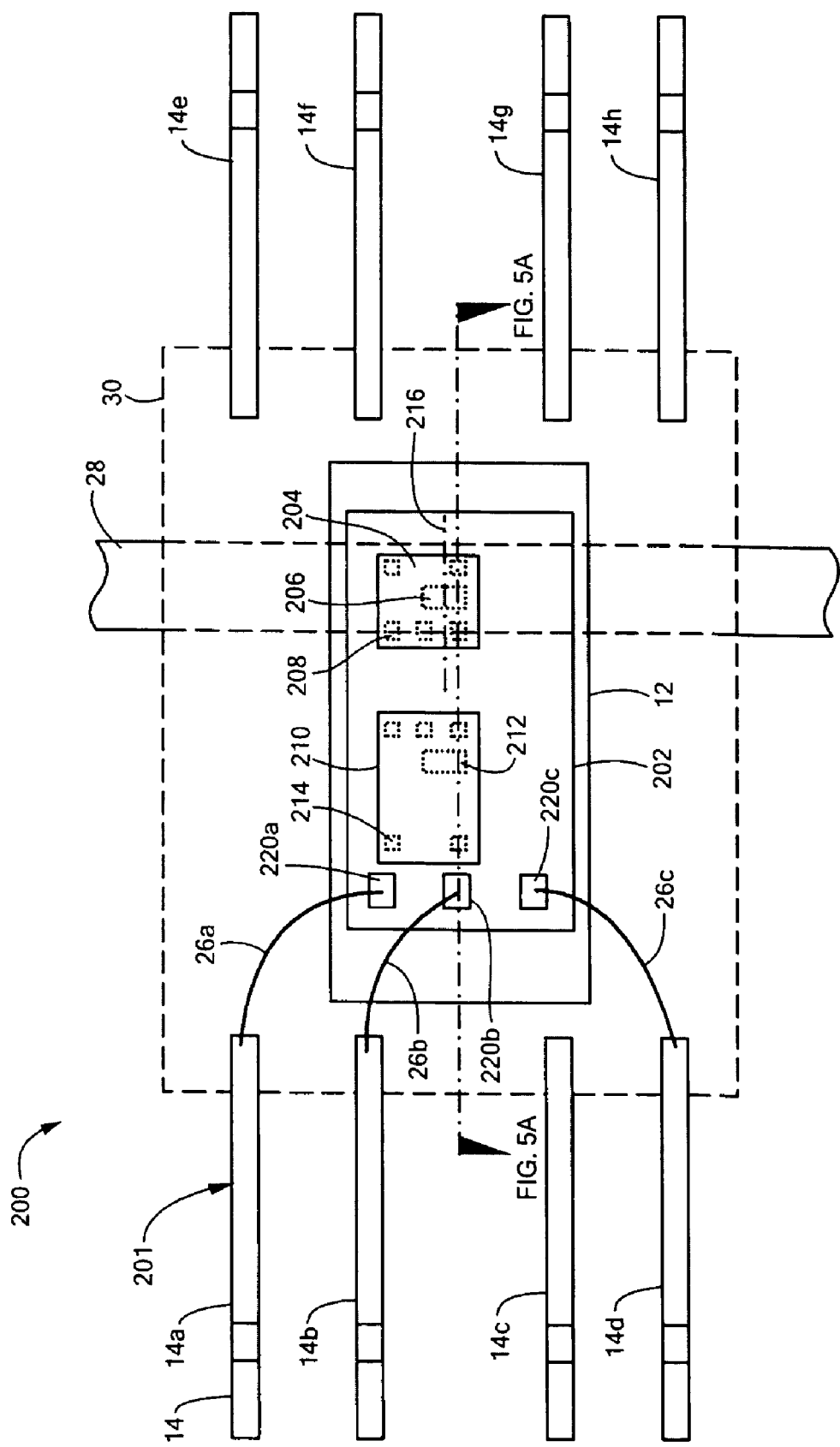
FIG. 5 is a pictorial showing another electronic circuit including an integrated circuit current sensor having first, second, and third substrates, a magnetic field sensing element disposed over a surface of the second substrate, and also including a current conductor.
Figure 5A:
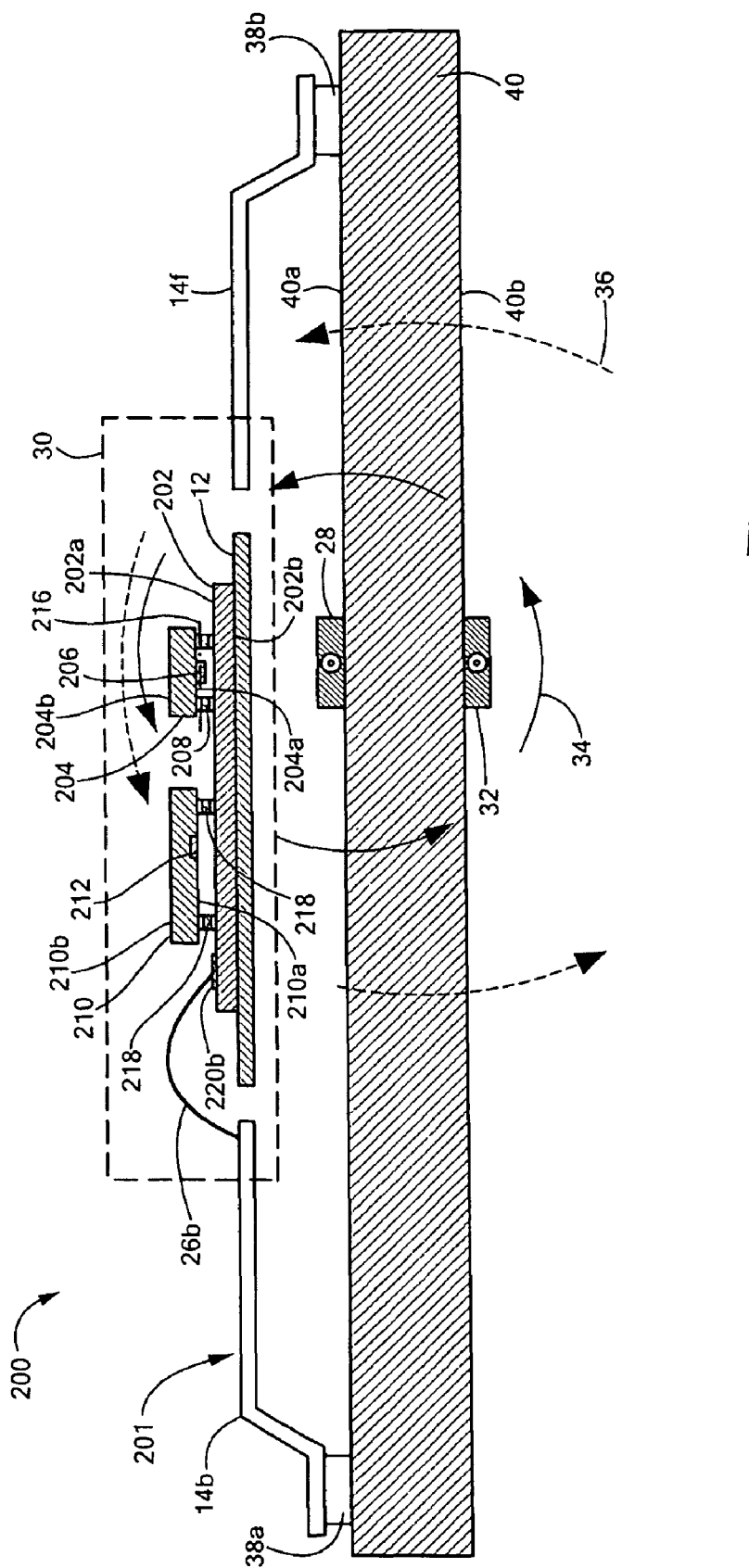
FIG. 5A is a cross-sectional view of the electronic circuit of FIG. 5.

Referring now to FIGS. 5 and 5A, in which like elements are shown having like reference designators, and in which like elements of FIGS. 1 and 1A are also shown having like reference designators, an electronic circuit 200 includes an integrated circuit current sensor 201. The electronic circuit 200 includes aspects similar to and functions in a way similar to the electronic circuit 10 of FIGS. 1 and 1A.

The current sensor 201 includes a first substrate 202 having first and second opposing surfaces 202a, 202b, respectively. The first substrate 202 is disposed over the base plate 12 such that the second surface 202b of the first substrate 202 is above the base plate 12 and the first surface 202a of the first substrate 202 is above the second surface 202b of the first substrate 202.

The integrated circuit 201 also includes a second substrate 204 having first and second opposing surfaces 204a, 204b, respectively, and a third substrate 210 having first and second opposing surfaces 210a, 210b, respectively. The first substrate 202 and the second substrate 204 are coupled such that the first surface 204a of the second substrate 204 is above the first surface 202a of the first substrate 202 and the second surface 204b of the second substrate 204 is above the first surface 204a of the second substrate 204. Similarly, the first substrate 202 and the third substrate 210 are coupled such that the first surface 210a of the third substrate 210 is above the first surface 202a of the first substrate 202 and the second surface 210b of the third substrate 210 is above the first surface 210a of the third substrate 210. The second and third substrates 204, 210, respectively, are disposed relative to the first substrate 202 in a flip-chip arrangement.

The first surface 204a of the second substrate 204 can be coupled to the first surface 202a of the first substrate 202 with bonds, of which a bond 208 is but one example. Similarly, the first surface 210a of the third substrate 210 can be coupled to the first surface 202a of the first substrate 202 with bonds, of which a bond 214 is but one example. The bonds (e.g., 208, 214) can be a selected one of a solder ball, a gold bump, a eutectic or high lead solder bump, a no-lead solder bump, a gold stud bump, a polymeric conductive bump, a conductive paste, or a conductive film.

The first, second, and third substrates 202, 204, 210, respectively, can be comprised of a variety of materials including, but not limited to, Si, GaAs, Inp, InSb, InGaAs, InGaAsP, SiGe, ceramic, or glass. The first, second, and third substrates 202, 204, 210, respectively, can be comprised of the same material or of different materials.

It will be appreciated that the second and third substrates 204, 210, respectively, can be electrically coupled together with circuit traces (not shown) on or within the first substrate 202.

The current sensor 201 can also include at least one electronic component 212 disposed on the first surface 210a of the third substrate 210. The electronic component 212 can include, but is not limited to, a passive electronic component, for example, a resistor, capacitor, or inductor, and an active electronic component, for example, a transistor, an amplifier, or another integrated circuit.

The current sensor 201 also includes a magnetic field sensing element 206 disposed over the first surface 204a of the second substrate 204. The magnetic field sensing element 206 can be the same as or similar to the magnetic field sensing element 18 of FIGS. 1 and 1A. The magnetic field sensing element 206 has a maximum response axis 216, which is essentially parallel to the first surface 204a of the second substrate 204. The current sensor 201 can straddle the current conductor 28 and/or 32.

For embodiments in which the magnetic field sensing element 206 is a Hall effect element, which can have maximum response axis substantially perpendicular to the first surface 204a of the second substrate 204, the magnetic field sensing element 206 can be disposed to the right or left of the position shown, so that the magnetic flux represented by the lines 34 passes more vertically with respect to the first surface 204a of the second substrate 204 and more vertically through the magnetic field sensing element 206.

In some other embodiments in which the magnetic field sensing element 206 is a Hall effect element, the entire current sensor 201 is disposed to the right or left of the current conductor 28 or 32 so that the current sensor 201 does not straddle the current conductor 28 or 32.

The current sensor 201 can also include a plurality of bonding pads, for example, bonding pads 220a-220c on the first surface 202a of the first substrate 202. Bond wires, for example, the bond wires 26a-26c, can couple the third substrate 210 to the leads, for example, the leads 14a, 14e, 14f of the lead frame 14.

It should be appreciated that various insulating layers can be used to electrically isolate portions of the current sensor 201 from other portions of the current sensor 201.

It will be apparent that the current sensor 201 straddles the first conductor 28 and also straddles the second conductor 32.

Figure 6:
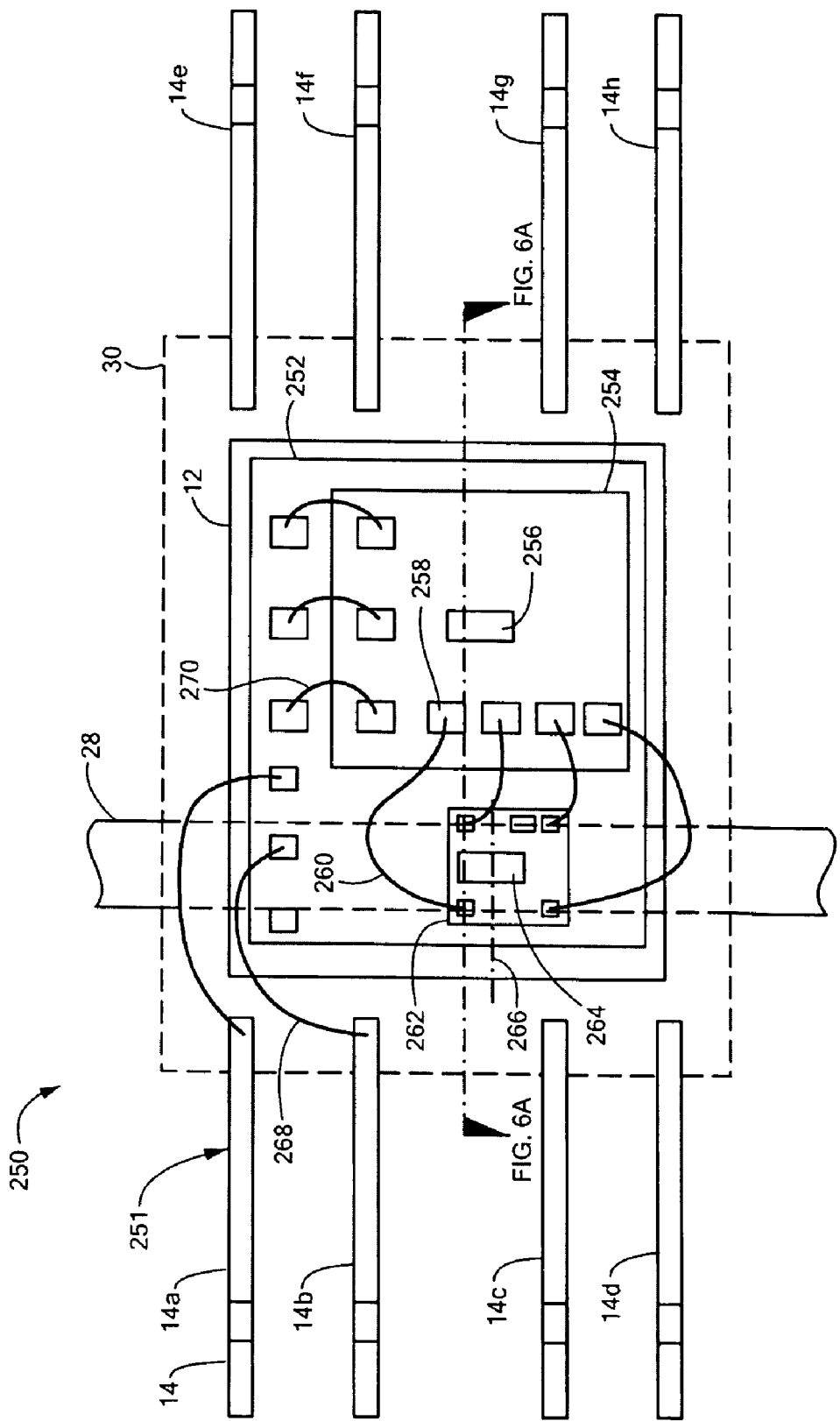
FIG. 6 is a pictorial showing an electronic circuit including an integrated circuit current sensor having first, second, and third substrates, a magnetic field sensing element disposed over a surface of the third substrate, and also including a current conductor.
Figure 6A:
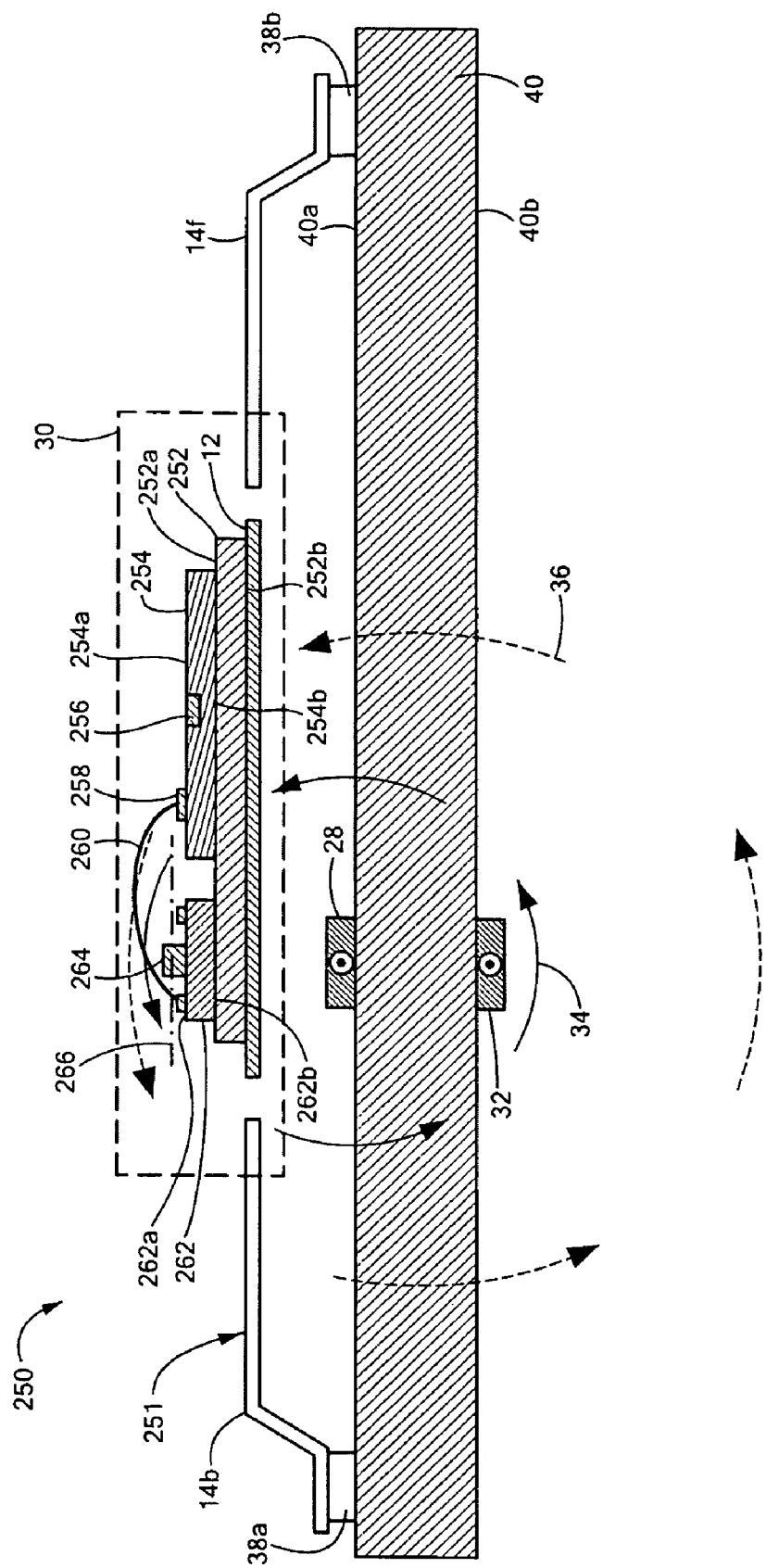
FIG. 6A is a cross-sectional view of the electronic circuit of FIG. 6.

Referring now to FIGS. 6 and 6A, in which like elements are shown having like reference designators, and in which like elements of FIGS. 1 and 1A are also shown having like reference designators, an electronic circuit 250 includes an integrated circuit current sensor 251. The electronic circuit 250 includes aspects similar to and functions in a way similar to the electronic circuit 10 of FIGS. 1 and 1A.

The current sensor 251 includes a first substrate 252 having first and second opposing surfaces 252a, 252b, respectively. The first substrate 252 is disposed over the base plate 12 such that the second surface 252b of the first substrate 252 is above the base plate 12 and the first surface 252a of the first substrate 252 is above the second surface 252b of the first substrate 252.

The integrated circuit 251 also includes a second substrate 254 having first and second opposing surfaces 254a, 254b, respectively, and a third substrate 262 having first and second opposing surfaces 262a, 262b, respectively. The first substrate 252 and the second substrate 254 are coupled such that the second surface 254b of the second substrate 254 is above the first surface 252a of the first substrate 252 and the first surface 254a of the second substrate 254 is above the second surface 254b of the second substrate 254. Similarly, the first substrate 252 and the third substrate 262 are coupled such that the second surface 262b of the third substrate 262 is above the first surface 252a of the first substrate 252 and the first surface 262a of the third substrate 262 is above the second surface 262b of the third substrate 262.

The first surface 254a of the second substrate 254 can be coupled to the first surface 262a of the third substrate 262 with bonds wires, of which a bond wire 260 is but one example. The first surface 254a of the second substrate 254 can also be coupled to the first surface 252a of the first substrate 252 with bonds wires, of which a bond wire 270 is but one example. The first surface 252a of the first substrate 252 can be coupled to the leads 14 with bond wires, of which a bond wire 268 is but one example.

The first, second, and third substrates 252, 254, 262, respectively, can be comprised of a variety of materials including, but not limited to, Si, GaAs, InP, InSb, InGaAs, InGaAsP, SiGe, ceramic, or glass. The first, second, and third substrates 252, 254, 262, respectively, can be comprised of the same material or of different materials.

The current sensor 251 can also include at least one electronic component 256 disposed on the first surface 254a of the second substrate 254. The electronic component 256 can include, but is not limited to, a passive electronic component, for example, a resistor, capacitor, or inductor, and an active electronic component, for example, a transistor, an amplifier, or another integrated circuit.

The current sensor 251 also includes a magnetic field sensing element 264 disposed over the first surface 262a of the third substrate 262. The magnetic field sensing element 264 can be the same as or similar to the magnetic field sensing element 18 of FIGS. 1 and 1A. The magnetic field sensing element 264 has a maximum response axis 266, which is essentially parallel to the first surface 262a of the third substrate 262. The current sensor 251 can straddle the current conductor 28 and/or 32.

For embodiments in which the magnetic field sensing element 264 is a Hall effect element, which can have maximum response axis substantially perpendicular to the first surface 262a of the third substrate 262, the magnetic field sensing element 264 can be disposed to the right or left of the position shown, so that the magnetic flux represented by the lines 34 passes more vertically with respect to the first surface 262a of the third substrate 262 and more vertically through the magnetic field sensing element 264.

In some other embodiments in which the magnetic field sensing element 264 is a Hall effect element, the entire current sensor 251 is disposed to the right or left of the current conductor 28 or 32 so that the current sensor 251 does not straddle the current conductor 28 or 32.

It should be appreciated that various insulating layers can be used to electrically isolate portions of the current sensor 251 from other portions of the current sensor 251.

It will be apparent that the current sensor 251 straddles the first conductor 28 and also straddles the second conductor 32.

Described above in conjunction with FIGS. 1, 1A, 2, 2A, 3, 3A, 4, 4A, 5, 5A, 6 and 6A, electronic components 22, 62, 116, 155, 212, and 256, respectively, can be disposed on surfaces of respective substrates. The electronic components can be comprised of circuits described in U.S. Pat. No. 7,075,287, issued Jul. 11, 2006, which application is incorporated by reference in its entirety.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An electronic circuit for sensing a current, comprising:
   a circuit board having first and second major opposing surfaces;
   a current conductor for carrying the current, the current conductor comprising a circuit trace disposed upon the circuit board; and
   an integrated circuit disposed upon and electrically coupled to the circuit board, wherein the integrated circuit comprises a magnetoresistance element for sensing a magnetic field associated with the current, wherein the current conductor is disposed upon the second surface of the circuit board, and wherein the integrated circuit is disposed upon the first surface of the circuit board at a position on the circuit board proximate to the current conductor.

2. The electronic circuit of claim 1, wherein the magnetoresistance element has a maximum response axis generally parallel to the first and second major opposing surfaces of the circuit board.

3. The electronic circuit of claim 2, wherein the magnetoresistance element is a giant magnetoresistance element.

4. The electronic circuit of claim 2, wherein the magnetoresistance element is a magnetic tunnel junction (MJT) element or a tunneling magnetoresistance (TMR) element.

5. The electronic circuit of claim 1, wherein the integrated circuit comprises a first substrate supporting at least one amplifier and a second substrate supporting the magnetoresistance element.

6. The electronic circuit of claim 5, wherein the second substrate is relatively disposed with the first substrate in a flip-chip arrangement.

7. The electronic circuit of claim 5, wherein the first and second substrates are supported by a third substrate.

8. The electronic circuit of claim 5, wherein the first and second substrates are supported by a third substrate and wherein at least one of the first substrate or the second substrate is relatively disposed in a flip-chip arrangement with the third substrate.

9. The electronic circuit of claim 1, wherein the integrated circuit includes a substrate having a surface supporting at least one amplifier and also supporting the magnetoresistance element.

10. An electronic circuit for sensing a current, comprising:
a circuit board having first and second major opposing surfaces;
a current conductor for carrying the current, the current conductor comprising a circuit trace disposed upon the circuit board; and
an integrated circuit disposed upon and electrically coupled to the circuit board, wherein the integrated circuit comprises a Hall effect element for sensing a magnetic field associated with the current, wherein the current conductor is disposed upon the second surface of the circuit board and wherein the integrated circuit is disposed upon the first surface of the circuit board at a position on the circuit board proximate to the current conductor.

11. The electronic circuit of claim 10, wherein the Hall effect element has a maximum response axis generally perpendicular to the first and second major opposing surfaces of the circuit board.

12. The electronic circuit of claim 10, wherein the integrated circuit comprises a first substrate supporting at least one amplifier and a second substrate supporting the Hall effect element.

13. The electronic circuit of claim 12, wherein the second substrate is relatively disposed with the first substrate in a flip-chip arrangement.

14. The electronic circuit of claim 12, wherein the first and second substrates are supported by a third substrate.

15. The electronic circuit of claim 12, wherein the first and second substrates are supported by a third substrate and wherein at least one of the first substrate or the second substrate is relatively disposed in a flip-chip arrangement with the third substrate.

16. The electronic circuit of claim 10, wherein the integrated circuit includes a substrate having a surface supporting at least one amplifier and also supporting the Hall effect element.

17. An electronic circuit for sensing a current, comprising:
a circuit board having first and second major opposing surfaces;
a current conductor for carrying the current, the current conductor comprising a circuit trace disposed upon the circuit board; and
an integrated circuit disposed upon and electrically coupled to the circuit board at a position so as to straddle the current conductor, wherein the integrated circuit comprises a magnetoresistance element for sensing a magnetic field associated with the current, wherein the integrated circuit comprises a first substrate supporting at least one amplifier and a second substrate supporting the magnetoresistance element, and wherein the second substrate is relatively disposed with the first substrate in a flip-chip arrangement.

18. An electronic circuit for sensing a current, comprising:
a circuit board having first and second major opposing surfaces;
a current conductor for carrying the current, the current conductor comprising a circuit trace disposed upon the circuit board; and
an integrated circuit disposed upon and electrically coupled to the circuit board at a position so as to straddle the current conductor, wherein the integrated circuit comprises a magnetoresistance element for sensing a magnetic field associated with the current, wherein the integrated circuit comprises a first substrate supporting at least one amplifier and a second substrate supporting the magnetoresistance element, wherein the first and second substrates are supported by a third substrate, and wherein at least one of the first substrate or the second substrate is relatively disposed in a flip-chip arrangement with the third substrate.

\* \* \* \* \*

UNITED STATES PATENT AND TRADEMARK OFFICE
CERTIFICATE OF CORRECTION

| | | |
|---|---|---|
| PATENT NO. | : 7,816,905 B2 | Page 1 of 1 |
| APPLICATION NO. | : 12/131339 | |
| DATED | : October 19, 2010 | |
| INVENTOR(S) | : Michael Doogue et al. | |

It is certified that error appears in the above-identified patent and that said Letters Patent is hereby corrected as shown below:

Col. 2, line 7, delete "having a" and replace with --having--.

Col. 2, line 54, delete "having magnetic" and replace with --having a magnetic--.

Col. 5, line 33, delete "current second conductor 32" and replace with --second current conductor 32--.

Col. 7, line 37, delete ", and" and replace with --, an--.

Col. 9, line 32, delete "layers" and replace with --layer--.

Signed and Sealed this
Twelfth Day of April, 2011

David J. Kappos
*Director of the United States Patent and Trademark Office*